United States Patent
Covington et al.

(10) Patent No.: US 11,791,008 B2
(45) Date of Patent: *Oct. 17, 2023

(54) METHODS AND DEVICES FOR TESTING MULTIPLE MEMORY CONFIGURATIONS

(71) Applicant: Advanced Micro Devices, Inc., Santa Clara, CA (US)

(72) Inventors: Glennis Eliagh Covington, Austin, TX (US); Benjamin Lyle Winston, Austin, TX (US); Santha Kumar Parameswaran, Austin, TX (US); Shannon T. Kesner, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,114

(22) Filed: Jan. 24, 2022

(65) Prior Publication Data

US 2022/0148669 A1 May 12, 2022

Related U.S. Application Data

(63) Continuation of application No. 16/578,209, filed on Sep. 20, 2019, now Pat. No. 11,232,847.

(51) Int. Cl.
*G11C 29/38* (2006.01)
*G11C 11/4093* (2006.01)

(52) U.S. Cl.
CPC .......... *G11C 29/38* (2013.01); *G11C 11/4093* (2013.01)

(58) Field of Classification Search
None
See application file for complete search history.

(56) References Cited

U.S. PATENT DOCUMENTS

| 8,599,631 B2 * | 12/2013 | Shaeffer | G11C 11/4063 365/72 |
| 9,837,132 B2 | 12/2017 | Ware et al. | |
| 2005/0010737 A1 | 1/2005 | Ware et al. | |
| 2010/0005219 A1 * | 1/2010 | Loughner | G11C 5/04 714/799 |

(Continued)

OTHER PUBLICATIONS

G. Kalyan and M. B. Srinivas, "An efficient ODT calibration scheme for improved signal integrity in memory interface," 2010 IEEE Asia Pacific Conference on Circuits and Systems, 2010, pp. 1211-1214, doi: 10.1109/APCCAS.2010.5775020. (Year: 2010).*

(Continued)

*Primary Examiner* — Daniel F. McMahon
(74) *Attorney, Agent, or Firm* — Volpe Koenig

(57) ABSTRACT

Methods, devices, and systems for testing a number of combinations of memory in a computer system. A modular memory device is installed in a memory channel in communication with a processor. The modular memory device includes a number of memory storage devices. The number of memory storage devices include a number of pins. For each of a number of subsets of the number of memory storage devices, a subset of the number of memory storage devices is selected, each pin of a subset of the number of pins which do not correspond to the subset of the number of memory storage devices is configured with a termination impedance, and the subset of the number of memory storage devices is tested.

20 Claims, 6 Drawing Sheets

(56) References Cited

U.S. PATENT DOCUMENTS

| | | | |
|---|---|---|---|
| 2010/0299468 A1* | 11/2010 | Linder | G06F 13/4086 710/108 |
| 2010/0299486 A1 | 11/2010 | Tambouris | |
| 2015/0131388 A1 | 5/2015 | Ware et al. | |
| 2015/0227440 A1* | 8/2015 | Ojalvo | G06F 11/1604 714/700 |
| 2019/0057029 A1 | 2/2019 | Grunzke | |

OTHER PUBLICATIONS

S. Seo et al. "Design and implementation of a mobile storage leveraging the DRAM interface,"2016 IEEE International Symposium on High Performance Computer Architecture (HPCA), 2016, pp. 531-542, doi: 10.1109/HPCA2016.7446092. (Year: 2016).
IDEC Solid State Technology Association, "JDEC DDR4 SDRAM Standard", 262 pgs., Jun. 2017.

* cited by examiner

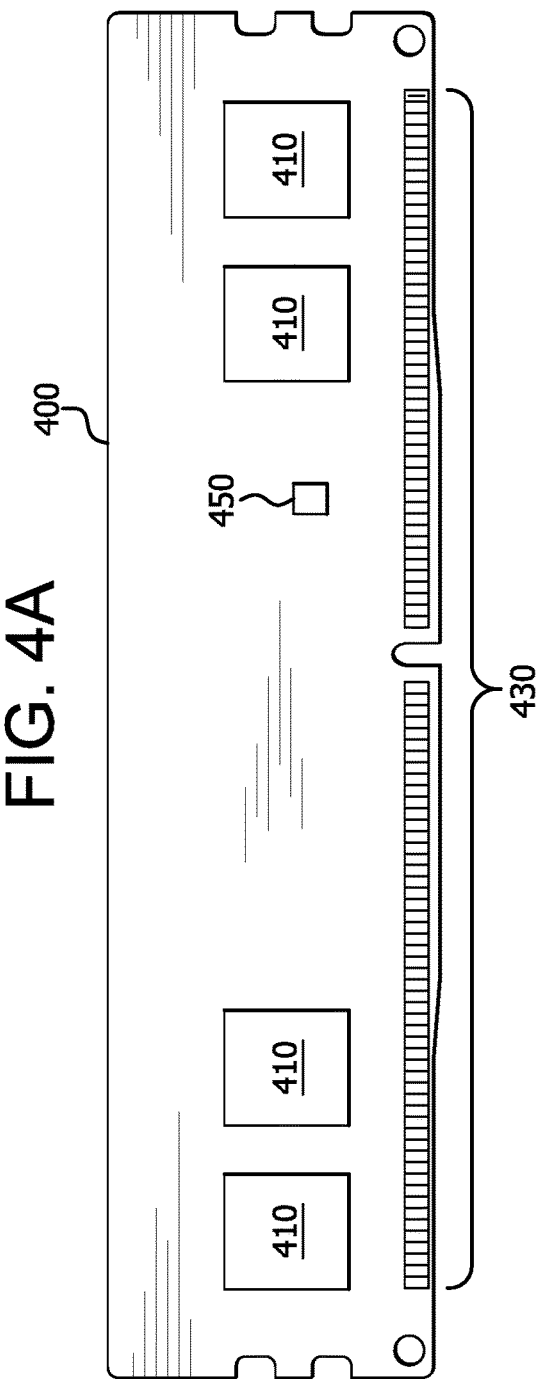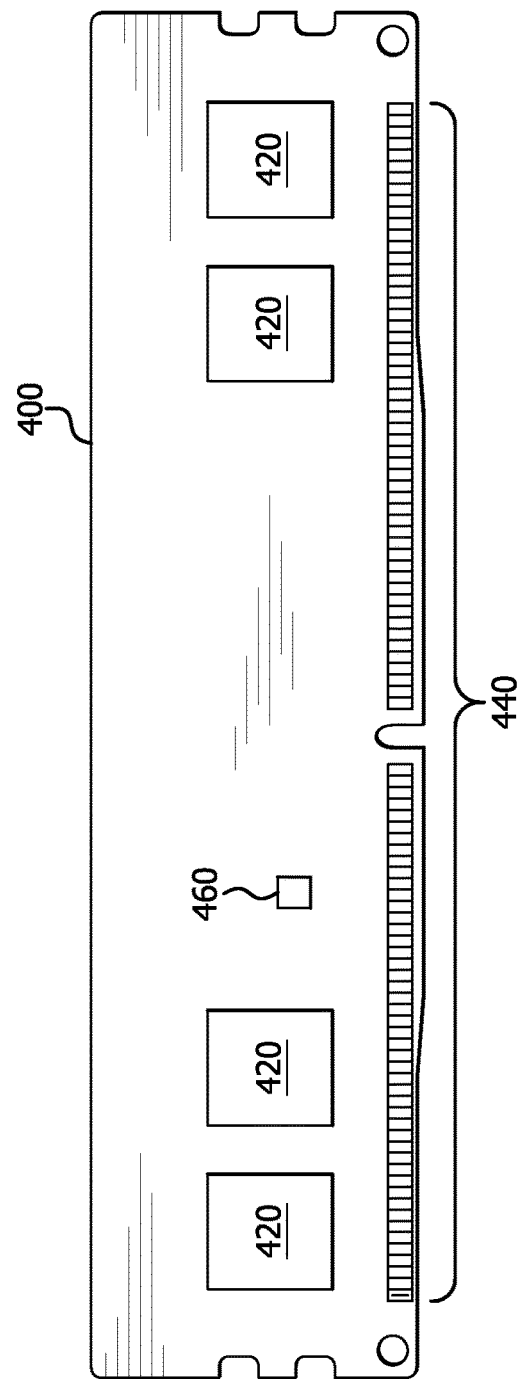

METHODS AND DEVICES FOR TESTING MULTIPLE MEMORY CONFIGURATIONS

CROSS REFERENCE TO RELATED APPLICATIONS

This application claims the benefit of U.S. patent application Ser. No. 16/578,209 filed Sep. 20, 2019, the content of which is hereby incorporated by reference herein.

BACKGROUND

Computer systems typically include random access memory (RAM). RAM is typically installed in a computer system in modular fashion to facilitate upgrading or reconfiguring the memory. For example, RAM is often implemented using a number of memory chips mounted on one or more memory module devices. The memory module devices are installed on a motherboard (or other suitable interface) for communication with other components of the computer system, such as a central processing unit (CPU), a graphics processing unit (GPU), and the like, over one or more memory channels. A common type of RAM includes dual data rate (DDR) memory chips mounted on dual in-line memory module (DIMM) devices. RAM devices typically communicate with the CPU, GPU, and/or other components of the computer system using a communications protocol. Examples of such communications protocols include DDR, PCIe, SATA, and the like.

Memory chips and modular memory devices are available in various rank categories (e.g., single rank, double rank), various supported speeds (e.g. 1600 Mega Transfers per second (MT/s), 3200 MT/s), various registration types (e.g., registered, unregistered), and so forth. Modular memory devices are also installable in various channel configurations on the motherboard. When designing a computer system, it is typical to test different kinds and combinations of modular memory devices for compatibility with the system.

BRIEF DESCRIPTION OF THE DRAWINGS

A more detailed understanding can be had from the following description, given by way of example in conjunction with the accompanying drawings wherein:

FIG. 4A is a front view of an example dual inline memory module (DIMM);

FIG. 4B is a back view of an example DIMM;

DETAILED DESCRIPTION

Figure 1:
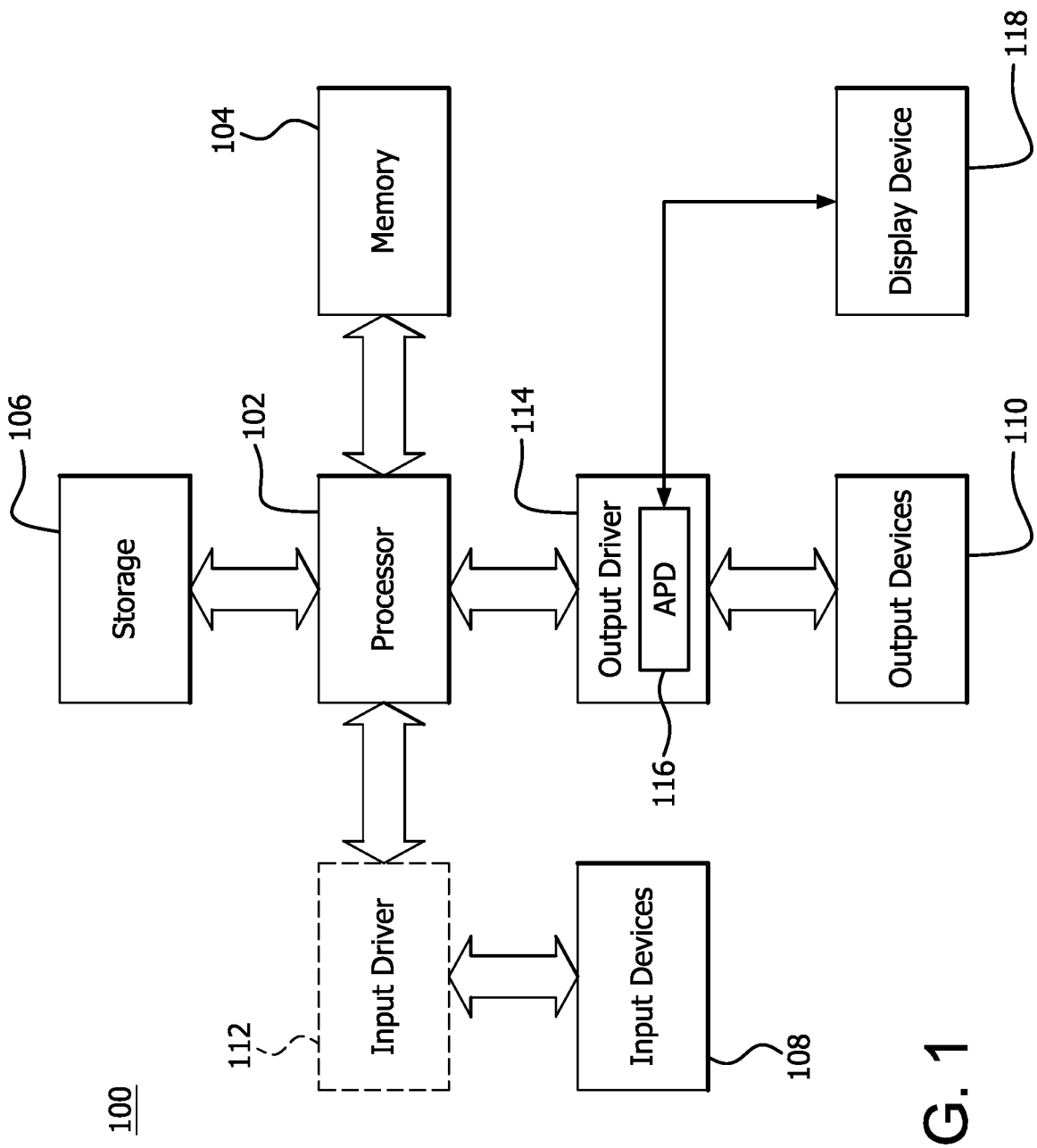
FIG. 1 is a block diagram of an example device in which one or more features of the disclosure can be implemented.

Some embodiments provide a method for testing a number of combinations of memory in a computer system. The method includes installing a modular memory device in a memory channel in communication with a processor. The modular memory device includes a number of memory storage devices. The number of memory storage devices include a number of pins. For each of a number of subsets of the number of memory storage devices, a subset of the number of memory storage devices is selected, each pin of a subset of the number of pins which do not correspond to the subset of the number of memory storage devices is configured with a termination impedance, and the subset of the number of memory storage devices is tested.

In some embodiments, the modular memory device includes a DIMM. In some embodiments, the memory storage devices include DRAM. In some embodiments, the modular memory device includes a number of ranks of the memory storage devices. In some embodiments, the method includes configuring each pin of the subset of the number of pins with the termination impedance using On-Die Termination (ODT). In some embodiments, the method includes configuring each pin of the subset of the number of pins with the termination impedance by a memory controller of the computer system. In some embodiments, the method includes executing a testing program on the processor which, for each of the subsets of the number of memory storage devices, automatically configures each pin of the subset of the number of pins and tests the subset of the number of memory storage devices.

Some embodiments provide a computer system configured to test a number of combinations of memory for use in the computer system. The computer system includes a processor, a memory channel in communication with the processor, and a modular memory device installed in the memory channel. The modular memory device includes a number of memory storage devices. The number of memory storage devices includes a number of pins. For each of a number of subsets of the number of memory storage devices, the processor is configured to select a subset of the number of memory storage devices, configure each pin of a subset of the number of pins which do not correspond to the subset of the number of memory storage devices with a termination impedance, and test the subset of the number of memory storage devices.

In some embodiments, the modular memory device includes a DIMM. In some embodiments, the memory storage devices include DRAM. In some embodiments, the modular memory device includes a number of ranks of the memory storage devices. In some embodiments, each pin of the subset of the number of pins is configured with the termination impedance using ODT. In some embodiments, the computer system includes a memory controller; wherein each pin of the subset of the number of pins is configured with the termination impedance by the memory controller. In some embodiments, the processor is further configured to execute a testing program which, for each of the subsets of the number of memory storage devices, automatically configures each pin of the subset of the number of pins and tests the subset of the number of memory storage devices.

Some embodiments provide a non-transitory computer readable medium having instructions thereon which when executed by a processor of a computer system, the processor in communication with a memory channel and a modular memory device installed in the memory channel, the modular memory device including a number of memory storage devices, the number of memory storage devices including a number of pins, cause the processor to perform the following actions. For each of a number of subsets of the number of memory storage devices, the processor selects a subset of the number of memory storage devices, configures each pin of a subset of the number of pins which do not correspond to the subset of the number of memory storage devices with a termination impedance, and tests the subset of the number of memory storage devices.

In some embodiments, the modular memory device includes a DIMM. In some embodiments, the memory storage devices include DRAM. In some embodiments, the modular memory device includes a number of ranks of the memory storage devices. In some embodiments, the processor configures each pin of the subset of the number of pins with the termination impedance using ODT. In some embodiments, the processor causes a memory controller to automatically configure each pin of the subset of the number of pins with the termination impedance.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is be located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 116 includes an accelerated processing device ("APD") 116 which is coupled to a display device 118. The APD is configured to accept compute commands and graphics rendering commands from processor 102, to process those compute and graphics rendering commands, and to provide pixel output to display device 118 for display. As described in further detail below, the APD 116 includes one or more parallel processing units configured to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and configured to provide graphical output to a display device 118. For example, it is contemplated that any processing system that performs processing tasks in accordance with a SIMD paradigm may be configured to perform the functionality described herein. Alternatively, it is contemplated that computing systems that do not perform processing tasks in accordance with a SIMD paradigm performs the functionality described herein.

Figure 2:
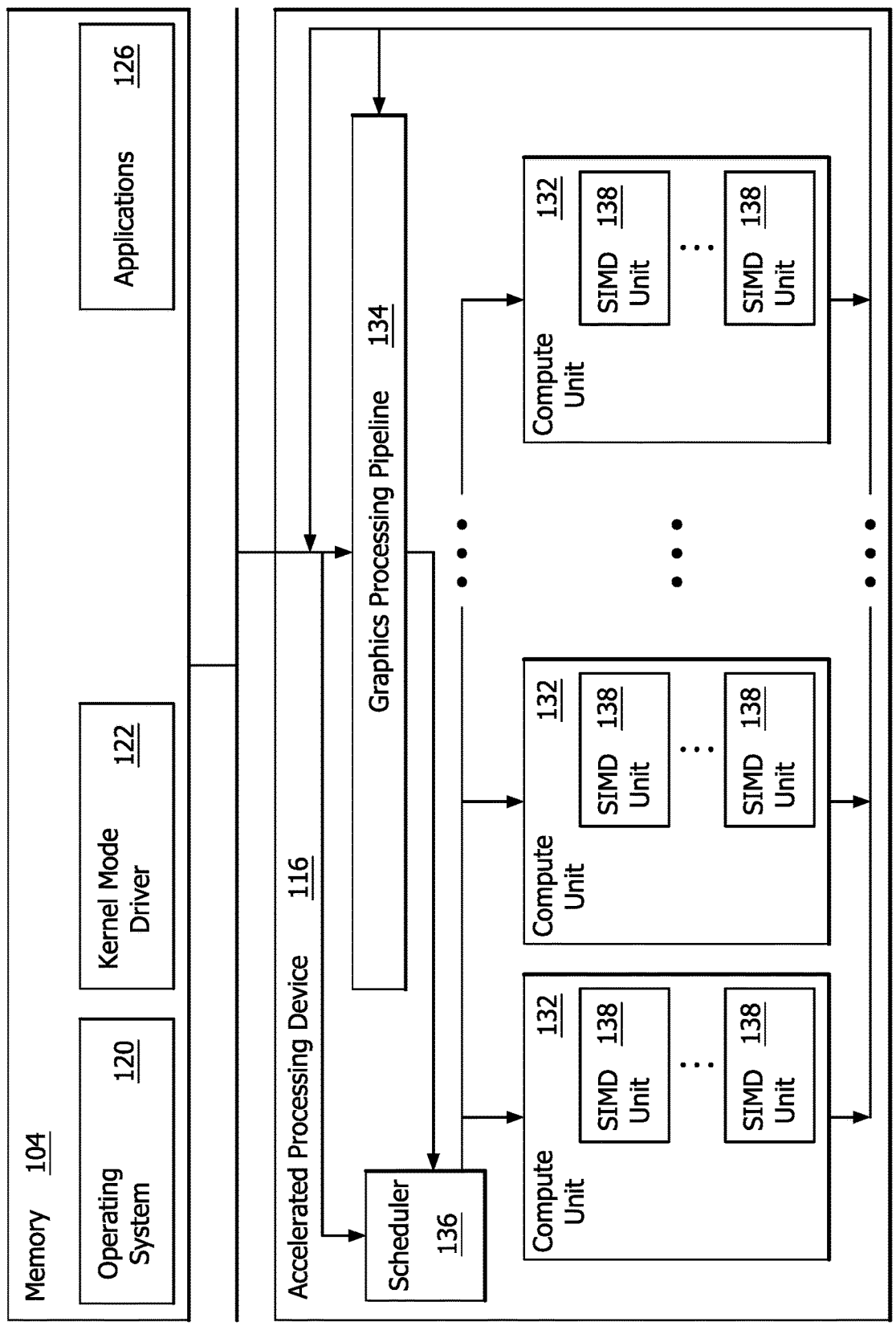
FIG. 2 is a block diagram of the device of FIG. 1, illustrating additional detail.

FIG. 2 is a block diagram of the device 100, illustrating additional details related to execution of processing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the processor 102 and the APD 116. For example, the operating system 120 directly communicates with hardware and provides an interface to the hardware for other software executing on the processor 102. The kernel mode driver 122 controls operation of the APD 116 by, for example, providing an application programming interface ("API") to software (e.g., applications 126) executing on the processor 102 to access various functionality of the APD 116. The kernel mode driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that are configured to perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequentially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wavefronts which are parallelized on two or more SIMD units 138 or serialized on the same SIMD unit 138 (or both parallelized and serialized as needed). A scheduler 136 is configured to perform operations related to scheduling various wavefronts on different compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

It is typical to test different kinds and combinations of modular memory devices to determine whether they are compatible or otherwise suitable for use with a particular computer system. Because of the wide variety of types, specifications, configurations, and manufacturers of memory devices, and because of the number of possible ways of installing memory module devices among the various memory channels of a computer system, qualifying memory for use in a given system can be costly both in terms of memory module device purchases, and in terms of time required to physically swap and reconfigure the memory module devices for testing.

Figure 3:
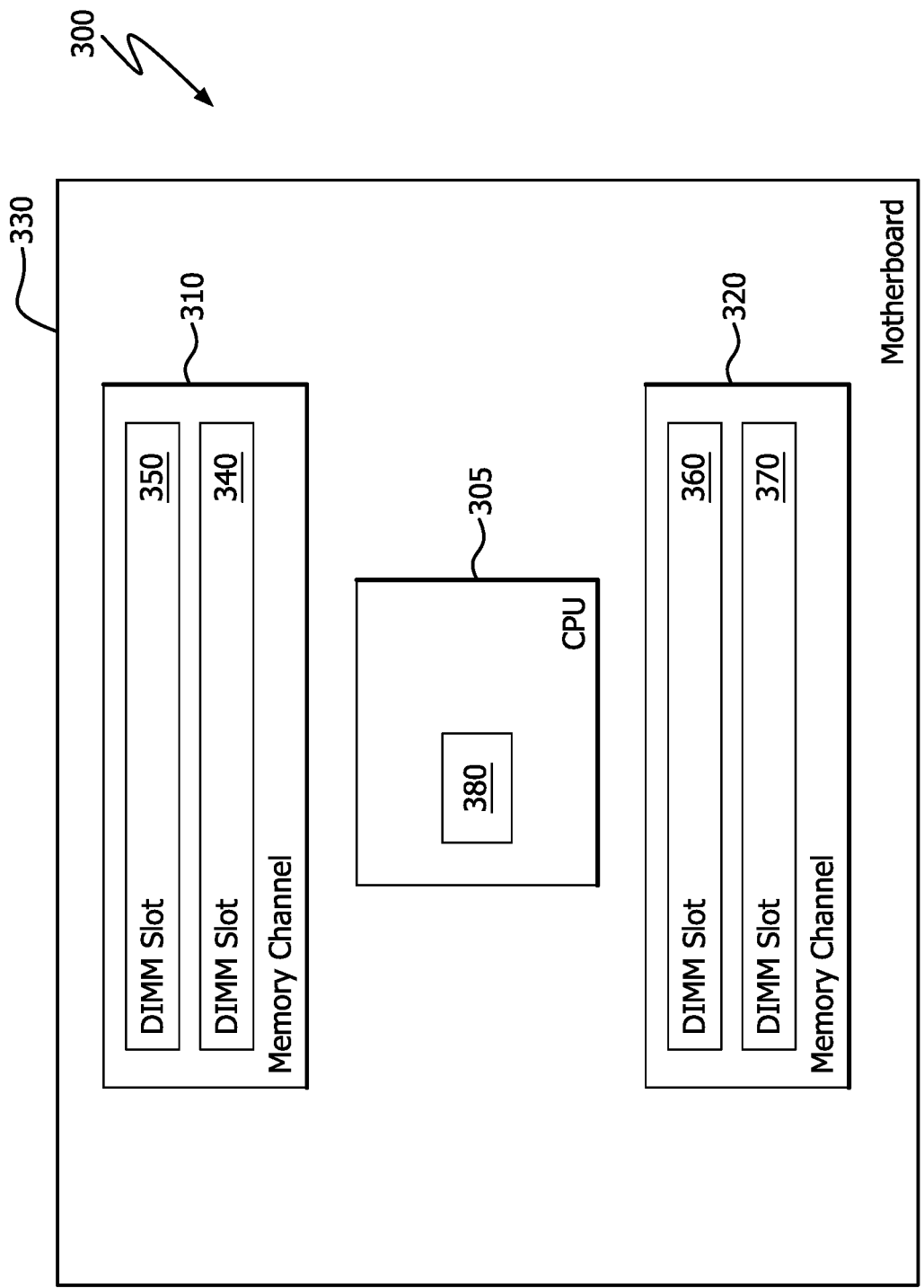
FIG. 3 is a block diagram illustrating a portion of an example computer system.

FIG. 3 is a block diagram illustrating a portion of an example computer system 300. Example computer system 300 is implementable, in some embodiments, using components of example device 100 as shown and described with respect to FIGS. 1 and 2.

Computer system 300 includes a CPU 310, and two memory channels 310, 320 in communication with CPU 310 via motherboard 330. Memory channel 310 includes DIMM slots 340, 350, and memory channel 320 includes DIMM slots 360, 370. DIMM slots 340 and 360 are referred to as "inside slots" herein, since they are closest to (i.e., they have the shortest length physical connection with, and accordingly, the shortest channel delay with) CPU 310 in their respective memory channels. DIMM slots 340 and 370 are referred to as "outside slots" herein, since they are furthest from (i.e., they have the longest length physical connection with, and accordingly, the longest channel delay with) CPU 310 in their respective memory channels. CPU 310 includes one or more memory controller(s) 380, which facilitates communication between and among CPU 310 and DIMM devices installed in DIMM slots 340, 350, 360, 370 over memory channels 310, 320. This terminology is used simply for ease of description herein; any suitable terminology is usable. Computer system 300 is implemented using DIMM memory modules which include DDR SDRAM memory chips for the sake of example and ease of description in the example of FIG. 3; however other types of memory are usable in other implementations.

Computer system 300 illustrates a simple example of a memory architecture which includes a single CPU and two memory channels supporting two DIMMs each. It is noted however that many other memory architectures are possible, including multiple CPUs, different numbers of memory channels, and different numbers of DIMMs per channel. For the sake of example and ease of description, computer system 300 requires balanced DIMM channels; i.e., DIMMs must be installed in pairs at the same distance from CPU 320. For example, under this requirement, if a DIMM is installed in slot 350 of channel 310, a matching DIMM is required to be installed in slot 370 of channel 320. Under these constraints, there are three possible physical installations of DIMM devices in computer system 300. In the first possible installation, a matching DIMM device is populated in each of DIMM slots 340, 350, 360, and 370. In the second possible installation, a matching DIMM device is populated in each of DIMM slots 340, 360, and each of DIMM slots 350 and 370 are left empty. In the third possible installation, a DIMM device is populated in each of DIMM slots 350 and 370, and each of DIMM slots 340 and 360 are left empty.

For purposes of the description herein, the matching DIMM devices are also required to have the same number of ranks, memory speed, memory capacity, registration (i.e., are either registered/buffered or unregistered/unbuffered) and manufacturer. It is noted hover that in other implementations, DIMM devices are not required to match in any or all of these respects, and/or are not required to be balanced on the memory channel, etc. For example, other memory architectures can permit and/or include both dual-rank and single-rank memory in the same channel, DIMMs populated only on one channel of two, and any other possible permutation of CPUs, channels, slots, and types of installed memory.

Although only three permutations of physical DIMM device installations are possible under the constraints of example computer system 300, it may be desired to use either dual-rank or single-rank DIMMs in various implementations. Further, it may be desired to use DIMM devices capable of running at different speeds in various implementations (e.g., 1600 Mega Transfers per second (MT/s) or 3200 MT/s). Assuming that requirement for balanced DIMM channels also applies to DIMM device ranking and DIMM memory speed, and that only unregistered/unbuffered memory is being tested in this example, the various possible physical installations of DIMM devices on computer system 300, for this example set of possible memory populations, speeds, and ranks, are illustrated in Table 1.

TABLE 1

| Installation # | DIMM Configuration | Rank Configuration | Memory Speed |
|---|---|---|---|
| 1 | Both Slots | Dual Rank | 3200 MT/s |
| 2 | Inside Slots | Dual Rank | 3200 MT/s |
| 3 | Outside Slots | Dual Rank | 3200 MT/s |
| 4 | Both Slots | Single Rank | 3200 MT/s |
| 5 | Inside Slots | Single Rank | 3200 MT/s |
| 6 | Outside Slots | Single Rank | 3200 MT/s |

TABLE 1-continued

| Installation # | DIMM Configuration | Rank Configuration | Memory Speed |
|---|---|---|---|
| 7 | Both Slots | Dual Rank | 1600 MT/s |
| 8 | Inside Slots | Dual Rank | 1600 MT/s |
| 9 | Outside Slots | Dual Rank | 1600 MT/s |
| 10 | Both Slots | Single Rank | 1600 MT/s |
| 11 | Inside Slots | Single Rank | 1600 MT/s |
| 12 | Outside Slots | Single Rank | 1600 MT/s |

Accordingly, 12 different physical installations of DIMM devices are testable on computer system 300, for each potentially compatible memory type, from each manufacturer for whom it is desired to qualify memory for use on computer system 300.

Computer systems having more complicated memory structures have a larger number of testable physical installations of DIMM devices in some cases. For example, another example computer system having one CPU with two memory channels per CPU and three DIMM devices per channel, supporting three possible memory speeds, would have a correspondingly higher number of possible physical installations of memory. Even with the simplifying assumption of balanced DIMM channels, purchasing a corresponding selection of DIMM devices and physically swapping these devices among the various DIMM slots of a motherboard becomes increasingly expensive and cumbersome in some implementations. The various possible physical installations of DIMM devices on such system, considering only dual rank memory and a single example speed, are illustrated in Table 2.

TABLE 2

| Installation # | Channel Configuration | Rank Configuration | Memory Speed |
|---|---|---|---|
| 1 | Both Channels All Three Slots | Dual Rank | 3200 MT/s |
| 2 | Both Channels Inside Two Slots | Dual Rank | 3200 MT/s |
| 3 | Both Channels Outside Two Slots | Dual Rank | 3200 MT/s |
| 4 | Both Channels Inside Slots Only | Dual Rank | 3200 MT/s |
| 5 | Both Channels Middle Slots Only | Dual Rank | 3200 MT/s |
| 6 | Both Channels Outside Slots Only | Dual Rank | 3200 MT/s |
| 7 | Inside Channels All Three Slots | Dual Rank | 3200 MT/s |
| 8 | Inside Channels Inside Two Slots | Dual Rank | 3200 MT/s |
| 9 | Inside Channels Outside Two Slots | Dual Rank | 3200 MT/s |
| 10 | Inside Channels Inside Slots Only | Dual Rank | 3200 MT/s |
| 11 | Inside Channels Middle Slots Only | Dual Rank | 3200 MT/s |
| 12 | Inside Channels Outside Slots Only | Dual Rank | 3200 MT/s |
| 13 | Outside Channels All Three Slots | Dual Rank | 3200 MT/s |
| 14 | Outside Channels Inside Two Slots | Dual Rank | 3200 MT/s |
| 15 | Outside Channels Outside Two Slots | Dual Rank | 3200 MT/s |
| 16 | Outside Channels Inside Slots Only | Dual Rank | 3200 MT/s |

TABLE 2-continued

| Installation # | Channel Configuration | Rank Configuration | Memory Speed |
|---|---|---|---|
| 17 | Outside Channels Middle Slots Only | Dual Rank | 3200 MT/s |
| 18 | Outside Channels Outside Slots Only | Dual Rank | 3200 MT/s |

Here, considering only dual rank memory, at a single speed, there are eighteen possible physical DIMM installations. Expanding this to consider two possible speeds, and both single and dual rank memory options, there would seventy-two possible physical DIMM installations. As can be seen from the examples of Table 1 and Table 2, physically reconfiguring the DIMM devices in order to qualify various combinations of memory for use in a particular computer system becomes increasingly burdensome as the size and/or complexity of the memory channel architecture increases.

FIGS. 4A and 4B are front and back views, respectively, of an example DIMM 400. DIMM 400 is a DDR4 dual-rank DIMM as defined in JEDEC standard JESD79-4B. DDR4 dual-rank DIMM is described here for the sake of example; however other types of DIMMs or other types of RAM memory devices are usable in other implementations, and various combinations of different types of DIMMs or other types of RAM memory devices are also usable in some architectures. DIMM 400 includes SDRAM devices 410 and 420, edge pins 430 and 440, and other supporting hardware 450 and 460. SDRAM devices 410, 420 are integrated circuits which contain SDRAM memory. Edge pins 430, 440 are used to connect SDRAM devices 410, 420 to a memory channel via a mounting on a motherboard or other suitable interface (e.g., DIMM slots 340, 350, 360, 370 and memory channels 310, 320 on motherboard 330, as shown and described with respect to FIG. 3). Supporting hardware 450, 460 includes any circuitry required to facilitate the functionality of DIMM 400, such as power supply circuitry, line termination circuitry, and so forth.

In DIMM 400, which is a dual-rank DIMM in this example, SDRAM devices 410 correspond to the first rank, and SDRAM devices 420 correspond to the second rank. It is noted that SDRAM devices corresponding to a particular rank are grouped on the same side of DIMM 400 for ease of description in this example. However, in some implementations, SDRAM devices corresponding to the same rank are not required to be disposed on the same side of a DIMM.

Edge pins 430, 440 provide access to both the first and second rank of the RAM memory of DIMM 400 (i.e., SDRAM devices 410, 420 in this example) by a CPU (e.g., CPU 310) or other components of a computer system. Certain of edge pins 430, 440 (e.g., chip select, clock, CKE, and ODT) are provided per rank (i.e, the first rank and second rank each have their own clock pin, etc.) Address and Data/DQS pins are shared between the first and second ranks (e.g., the same address pins are used to address both ranks).

Edge pins 430, 440, include data pins, strobe pins, address pins, chip select pins, and other pins as defined in the corresponding JEDEC standards. If an address is supplied to address pins of the edge pins 430, 440, a suitable chip select signal supplied to the chip select pins (e.g., by a DRAM controller of the computer system) selects which rank to access using the address.

One approach to testing various combinations of memory installed in a computer system is to fill all slots of all channels with DIMM devices supporting the highest number of ranks possible, and to leverage the chip-select functionality of the DIMM select only the desired devices. For example, to qualify dual rank and single rank memory of the same speed, in the same slot configuration, each rank could be selected or deselected for testing as desired, using chip select pins. It is noted, however, that unused modules and ranks, if left in place physically in the memory channel, impact transmission line impedance in the memory channel. This impact has the potential to alter transmission characteristics and signal integrity in the memory channel. For example, reading from and writing to only one DIMM while a second DIMM remains installed in the channel, or reading from and writing to only one rank of a dual-ranked DIMM, in some cases, results in reflections and other distortions in communications that would yield inaccurate testing results due to degraded signal integrity, altered edge rates, and/or other alterations in communications on the memory channel. Put simply, the test data generated under this approach would likely not be sufficiently similar to corresponding test data produced by removal of the unused modules (or replacement of a dual ranked DIMM with a single ranked DIMM, and so forth) to properly qualify the memory.

Some types of modern RAM support configurable termination of various signals on the DIMM device. For example, according to the JEDEC standards, a DDR4 SDRAM chip implemented on a DIMM device supports an ODT function, by which a memory controller (i.e., a DRAM controller in this example) is able to independently change termination resistance and/or impedance for various pins on any or all of the installed SDRAM devices, using resistors or active components. For example, each DDR4 SDRAM chip on the DIMM device can be configured with various termination resistance values for data (DQ) pins, data strobe (DQS) pins, termination data strobe (TDQS) pins, and other pins. The termination values (e.g., resistance levels) can be changed, for example, in order to match, substantially match, or approximately match, the impedance of the pin to the memory channel. Various other types of RAM (e.g., conforming to JEDEC standards or other standards) also support ODT or similar configurable termination resistance or impedance values.

Such configurable termination functionality is usable to improve signal integrity in the memory channel. For example, if a read command is issued to an address corresponding to a first rank of a dual-rank DIMM, the ODTs of the corresponding DQ pins on the second rank DRAMs are configurable by the DRAM controller to match, substantially match, or approximately match, the impedance of the memory channel. In some cases, configuring the ODTs of the memory pins in this way makes the second rank pin effectively and/or substantially electrically "invisible" to the memory channel during the read operation, minimizing or reducing reflections and other sources of signal degradation on the read data. A pin that is impedance matched in this way so as to be effectively and/or substantially electrically "invisible" to the memory channel is referred to as "latent."

Figure 5:
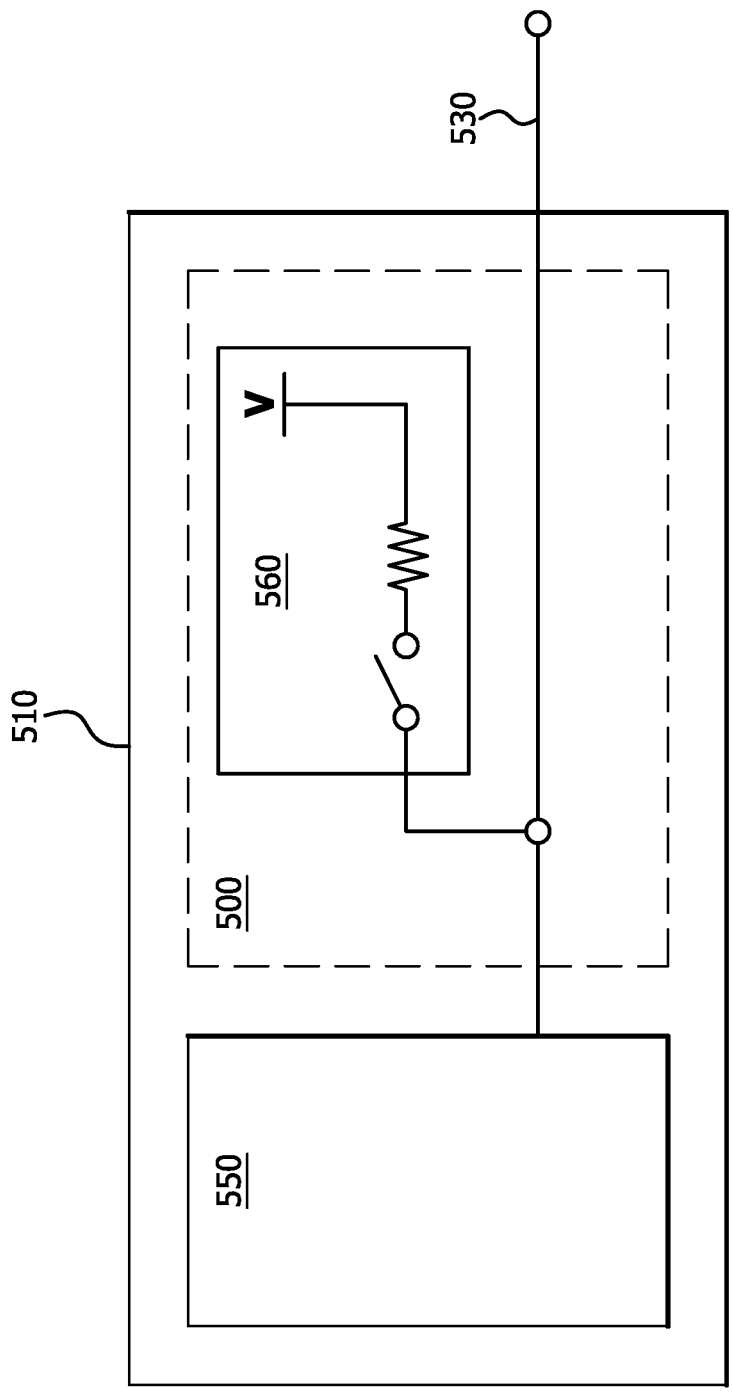
FIG. 5 is a schematic diagram illustrating an example configurable on-die termination circuit.

FIG. 5 is a schematic diagram illustrating an example configurable ODT circuit 500. Example configurable ODT circuit 500 is implementable on DIMM 400 as shown and described with respect to FIGS. 4A and 4B, for example, or with any other suitable memory devices. In FIG. 5, ODT circuit 500 is implemented on an example RAM chip 510 (e.g., an SDRAM chip), and is configured to match impedance of memory circuitry 550 with read pin 530. The functionality of ODT circuit 500 is illustrated, for example, by ODT circuit model 560. ODT circuit model 560 functionally illustrates selective connectivity between an example voltage high signal and pin 530 via a resistive load.

It is noted that ODT circuit model 560 is simplified and illustrates ODT circuit 500 as a simplified model for ease of description. Any equivalent or otherwise suitable circuitry for configurably matching the impedance of pin 530 to a memory channel with which it is connected can be used in various implementations. ODT circuit 500 is configurable, e.g., by a DRAM controller, to connect the voltage high signal to pin 530, via the resistive load, under various circumstances where it is desired to match the impedance of pin 530 to a memory channel to which it is connected. In some implementations, the resistive load of ODT circuit 500 is configurable among a plurality of resistance values (e.g., by the DRAM controller) to match the impedance of pin 530 under different configurations of the memory channel.

Configurable terminations, such as the ODT defined in JEDEC standards, are used to terminate parts of the memory that are included in the memory map of the system under certain circumstances. For example, available terminations, such as RTT_WR, RTT_PARK, RTT_NOM, RTT_NOM/WR, are used to terminate memory chip pins that are available for use by the memory system (i.e., are part of the memory map) but which happen to be idle. The configuration schemes provided by JEDEC standards are defined only with respect to memory chip pins that are part of the memory map however. For example, as mentioned above, a memory controller can configure ODT to terminate an address pin of a second rank DRAM when reading a corresponding address of a first rank DRAM, since both pins are part of the memory map. The standards do not define termination of address pins that are not part of the memory map, however. Accordingly, some implementations include termination schemes for unused memory components (e.g., DIMMs, ranks, DRAMs, etc.) that are not part of the memory map for a particular memory configuration under test.

Some embodiments for testing various combinations of memory installed in a computer system include filling all slots of all channels with DIMM devices supporting the highest number of rankings possible, and leveraging the chip-select functionality of the DIMM to select only the devices desired for testing. For example, to qualify dual ranked and single raked memory of the same speed, in the same slot configuration, each rank could be selected or deselected for testing as desired, using chip select pins. As noted earlier, unused modules and ranks left in place physically in the memory channel have the potential to impact transmission line impedance in the memory channel, altering transmission characteristics and signal integrity in the memory channel. However, by selectively enabling ODT functionality on the pins of unselected memory devices (e.g., address pins, read pins, on unused ranks, DIMMs, etc.), the unselected memory devices are made effectively and/or substantially electrically "invisible" to the memory channel (i.e., are made latent) during testing. Accordingly, some implementations include configurable termination of unselected memory devices (e.g., DIMMs, ranks, DRAMs, etc.) that are not part of the memory map of the particular combination of memory under test. This can have the advantage of allowing multiple different configurations of DIMM memory (or other memory types) to be tested without physically reinstalling the DIMM devices for each configuration.

Unlike approaches which use only the chip select functionality of the DIMMs to select and deselect memory devices, embodiments which also leverage configurable pin terminations, such as ODT, can provide test data for multiple configurations that is sufficiently similar to corresponding test data produced by removal of the unused modules (or replacement of a dual ranked DIMM with a single ranked DIMM, and so forth) to properly qualify the memory.

Table 3 illustrates the various possible physical installations of DIMM devices on computer system 300, shown and described with respect to FIG. 3, which were enumerated in Table 1. FIG. 3 includes an additional column listing pin termination configurations (e.g., which pins are made latent using ODT) for each physical installation, to enable testing of these installations without physically removing and/or rearranging the DIMM devices to change the slot configuration, or rank configuration.

TABLE 3

| Installation # | Parked Pins | Channel Configuration | Rank Configuration | Memory Speed |
|---|---|---|---|---|
| 1 | None | Both Slots | Dual Rank | 3200 MT/s |
| 2 | Both Ranks, Outside Slots | Inside Slots | Dual Rank | 3200 MT/s |
| 3 | Both Ranks, Inside Slots | Outside Slots | Dual Rank | 3200 MT/s |
| 4 | One Rank, Both Slots | Both Slots | Single Rank | 3200 MT/s |
| 5 | One Rank, Outside Slots | Inside Slots | Single Rank | 3200 MT/s |
| 6 | One Rank, Inside Slots | Outside Slots | Single Rank | 3200 MT/s |
| 7 | None | Both Slots | Dual Rank | 1600 MT/s |
| 8 | Both Ranks, Outside Slots | Inside Slots | Dual Rank | 1600 MT/s |
| 9 | Both Ranks, Inside Slots | Outside Slots | Dual Rank | 1600 MT/s |
| 10 | One Rank, Both Slots | Both Slots | Single Rank | 1600 MT/s |
| 11 | One Rank, Outside Slots | Inside Slots | Single Rank | 1600 MT/s |
| 12 | One Rank, Inside Slots | Outside Slots | Single Rank | 1600 MT/s |

In the example illustrated in Table 3, installation #1 is tested by physically installing dual-rank DIMM devices, capable of running at 3200 MT/s, in both slots of both channels. After this configuration is tested, a test program running on the computer system makes both ranks of the DIMM devices populating the outside slots of both channels latent in order to effectively test installation #2. Because no physical removal of DIMM devices is required to emulate installation #2, testing can proceed much more quickly. Similarly, installation #4 is tested by "parking" one rank each of both slots of both channels, in order to emulate single-rank memory. Because the same dual-rank memory DIMM devices used to test installation #1 are used in this approach, it is not necessary to purchase or install specific single-rank memory. By stepping through the various pin termination (i.e., "parking") configurations itemized in Table 3, all of the possible installations are testable, for the 3200 MT/s memory speed, without removing or rearranging any of the DIMM modules. Further, if the DIMM devices are configurable also to run at the slower 1600 MT/s speed, all of the possible installations are testable without removing or rearranging any of the DIMM modules. Because no physical rearrangement is needed in this approach, all of the possible physical installations of DIMM devices are testable automatically by the test program. This can have the advantage of increasing speed and decreasing costs associated with memory testing for a computer system.

Figure 6:
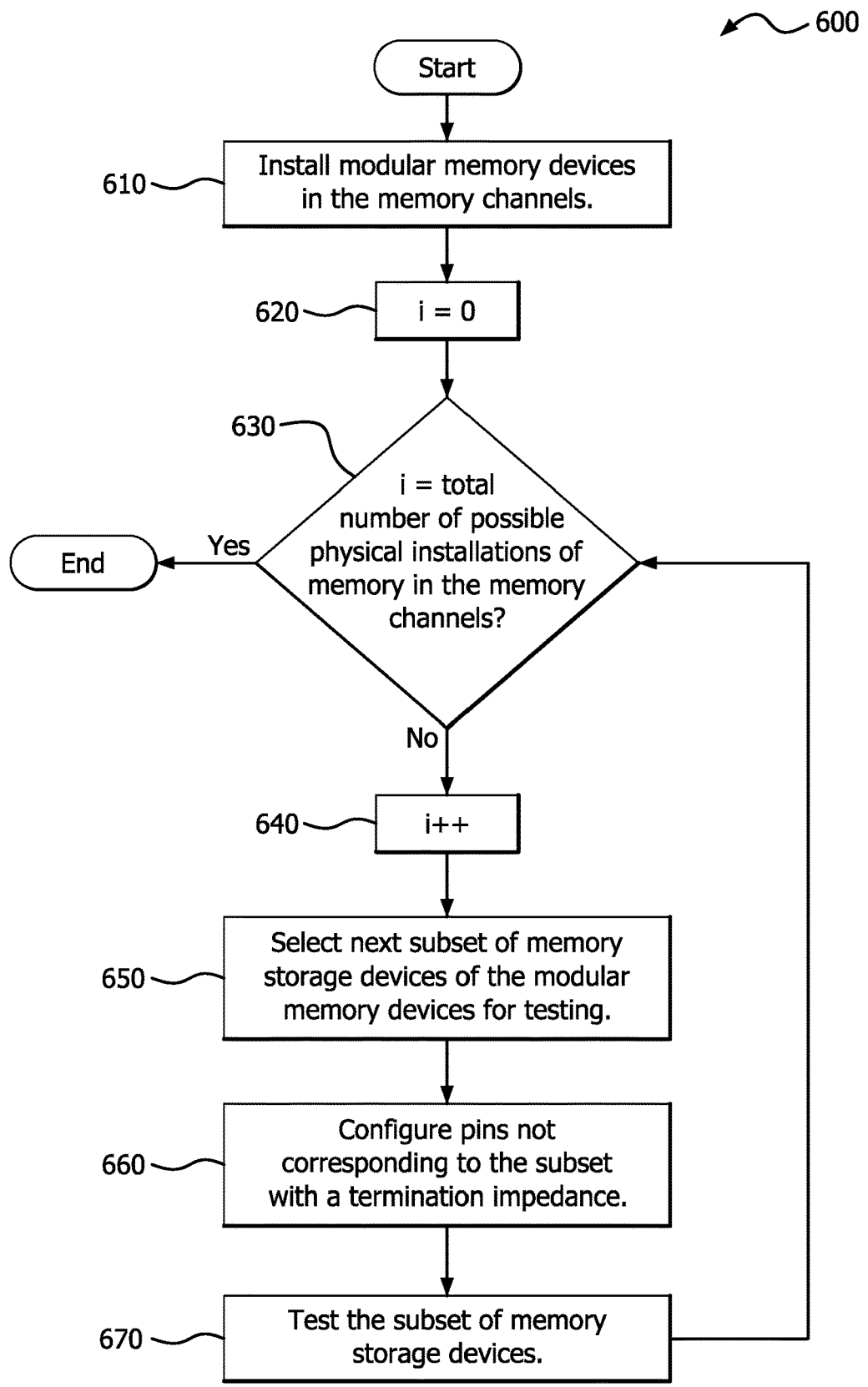
FIG. 6 is a flow chart illustrating an example method for testing memory configurations in a computer system, such as shown and described with respect to FIG. 3.

FIG. 6 is a flow chart illustrating an example method 600 for testing memory configurations in a computer system, such as computer system 300 as shown and described with respect to FIG. 3.

In step 610, modular memory devices are installed in memory channels of the computer system such that they are in communication with a processor. Each modular memory device includes a plurality of pins which correspond to a plurality of memory storage devices on the modular memory device. In some implementations, the modular memory devices are DIMM devices, the memory storage devices are DDR4 SDRAM chips (or other DRAM) disposed on the DIMM devices, and the pins are disposed along an edge of the DIMM devices to facilitate communication between the memory channel and the chips. In some implementations, the modular memory devices include a plurality of ranks of memory storage.

A loop counter i for tracking the number of memory configurations to test is initialized to zero in step 620. On condition 630 that the loop counter i is not equal to the total number of memory configurations to test, the loop counter i is incremented in step 640. Steps 620, 630, and 640 illustrate one example approach to iterating through each of the memory configurations for testing, however it is noted that any suitable iteration arrangement is usable in other implementations.

A subset (or, the next subset) of memory storage devices of the modular memory devices is selected for testing in step 650. In some implementations, the subset includes one or more ranks of the memory devices, and the ranks are selected using chip select pins of the modular memory devices. In some implementations, a testing program executing on the processor automatically selects the subset of the plurality of memory storage devices.

Pins of the modular memory device that are not associated with the subset for testing are configured with a termination impedance to match, substantially match, or approximately match, the impedance of the memory channel (i.e., are made latent) in step 660. In some implementations, the pins are parked using ODT. In some implementations, a memory controller of the computer system parks the pins. In some implementations, a testing program executing on the processor automatically parks the pins.

The subset of memory storage devices selected for testing in step 650 is tested in step 670. In some implementations, a testing program executing on the processor automatically tests the subset of the plurality of memory storage devices.

After testing in step 670, the flow returns to condition 630. On condition 630 that the loop counter i is equal to the total number of memory configurations to test (e.g., 18 in the example of Table 3), the procedure ends.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for terminating memory component pins in a computer system, the method comprising:
   selecting, by a processor, a subset of a plurality of memory storage devices for test;
   selecting, by the processor, at least one pin of the plurality of memory storage devices not corresponding to the subset of the plurality of memory storage devices; and
   configuring, by the processor, the at least one pin with a termination impedance.

2. The method of claim 1, wherein the plurality of memory storage devices are components of a dual in-line memory module (DIMM).

3. The method of claim 1, wherein the plurality of memory storage devices comprise dynamic random access memory (DRAM).

4. The method of claim 1, wherein the plurality of memory storage devices comprise components of at least one rank of a modular memory device.

5. The method of claim 1, further comprising configuring the at least one pin with the termination impedance using on-die termination (ODT).

6. The method of claim 1, further comprising configuring the at least one pin with the termination impedance by a memory controller of the computer system.

7. The method of claim 1, further comprising executing, by the processor, a testing program which tests the subset of the plurality of memory storage devices.

8. A computer system configured to terminate memory component pins, the computer system comprising:
   a processor;
   a memory channel in communication with the processor; and
   a modular memory device in communication with the memory channel, the modular memory device including a plurality of memory storage devices, the plurality of memory storage devices including a plurality of pins;
   wherein the processor is configured to:
      select a subset of the plurality of memory storage devices for testing;
      select at least one pin not corresponding to the subset of the plurality of memory storage devices; and
      configure the at least one pin with a termination impedance.

9. The computer system of claim 8, wherein the modular memory device comprises a dual in-line memory module (DIMM).

10. The computer system of claim 8, wherein the memory storage devices comprise dynamic random access memory (DRAM).

11. The computer system of claim 8, wherein the modular memory device comprises a plurality of ranks of the memory storage devices.

12. The computer system of claim 8, wherein the at least one pin is configured with the termination impedance using on-die termination (ODT).

13. The computer system of claim 8, further comprising a memory controller; wherein the at least one pin is configured with the termination impedance by the memory controller.

14. The computer system of claim 8, wherein the processor is further configured to execute a testing program which tests the subset of the plurality of memory storage devices.

15. A non-transitory computer readable medium having instructions thereon which when executed by a processor of a computer system, cause the processor to:
   select a subset of a plurality of memory storage devices to be tested; and
   configure at least one pin of a plurality of memory storage devices not corresponding to the subset with a termination impedance.

16. The non-transitory computer readable medium of claim 15, wherein the memory storage devices are components of a dual in-line memory module (DIMM).

17. The non-transitory computer readable medium of claim 15, wherein the memory storage devices comprise dynamic random access memory (DRAM).

18. The non-transitory computer readable medium of claim 15, wherein the memory storage devices comprise a plurality of ranks.

19. The non-transitory computer readable medium of claim 15, further comprising instructions which when executed by the processor, cause the processor to configure the at least one pin with the termination impedance using on-die termination (ODT).

20. The non-transitory computer readable medium of claim 15, further comprising instructions which when executed by the processor, cause a memory controller to configure the at least one pin with the termination impedance.

* * * * *